(12) United States Patent
Cheng et al.

(10) Patent No.: US 9,627,277 B2
(45) Date of Patent: Apr. 18, 2017

(54) METHOD AND STRUCTURE FOR ENABLING CONTROLLED SPACER RIE

(71) Applicant: International Business Machines Corporation, Armonk, NY (US)

(72) Inventors: Kangguo Cheng, Schenectady, NY (US); Ryan O. Jung, Rensselaer, NY (US); Fee Li Lie, Albany, NY (US); Eric R. Miller, Albany, NY (US); Jeffrey C. Shearer, Albany, NY (US); John R. Sporre, Albany, NY (US); Sean Teehan, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/734,615

(22) Filed: Jun. 9, 2015

(65) Prior Publication Data

US 2016/0365292 A1    Dec. 15, 2016

(51) Int. Cl.
| | | |
|---|---|---|
| *H01L 21/84* | (2006.01) | |
| *H01L 29/66* | (2006.01) | |
| *H01L 21/311* | (2006.01) | |
| *H01L 21/3105* | (2006.01) | |
| *H01L 21/308* | (2006.01) | |
| *H01L 21/66* | (2006.01) | |
| *H01L 27/12* | (2006.01) | |

(52) U.S. Cl.
CPC .......... *H01L 21/845* (2013.01); *H01L 21/308* (2013.01); *H01L 21/31051* (2013.01); *H01L 21/31116* (2013.01); *H01L 22/26* (2013.01); *H01L 27/1211* (2013.01); *H01L 29/6656* (2013.01); *H01L 29/66545* (2013.01)

(58) Field of Classification Search
CPC ............. H01L 21/845; H01L 21/31116; H01L 27/1211; H01L 29/66545; H01L 22/26; H01L 21/31051; H01L 29/6656; H01L 21/308

See application file for complete search history.

(56) References Cited

U.S. PATENT DOCUMENTS

| | | | |
|---|---|---|---|
| 6,564,114 B1 | 5/2003 | Toprac et al. | |
| 7,383,521 B2 | 6/2008 | Smith et al. | |
| 2005/0048753 A1* | 3/2005 | Schwan | H01L 21/823864 438/595 |
| 2009/0089732 A1 | 4/2009 | Van Adrichem et al. | |
| 2014/0145247 A1* | 5/2014 | Cheng | H01L 29/66545 257/288 |
| 2014/0231885 A1* | 8/2014 | Xie | H01L 21/823437 257/288 |

(Continued)

*Primary Examiner* — Marc Armand
*Assistant Examiner* — Sue Tang
(74) *Attorney, Agent, or Firm* — Scully, Scott, Murphy & Presser, P.C.; Steven J. Meyers

(57) ABSTRACT

A method and structure to enable reliable dielectric spacer endpoint detection by utilizing a sacrificial spacer fin are provided. The sacrificial spacer fin that is employed has a same pitch as the pitch of each semiconductor fin and the same height as the dielectric spacers on the sidewalls of each semiconductor fin. Exposed portions of the sacrificial spacer fin are removed simultaneously during a dielectric spacer reactive ion etch (RIE). The presence of the sacrificial spacer fin improves the endpoint detection of the spacer RIE and increases the endpoint signal intensity.

10 Claims, 17 Drawing Sheets

(56) References Cited

U.S. PATENT DOCUMENTS

2015/0255557 A1* 9/2015 Zhu .................. H01L 29/78
257/372
2015/0372104 A1* 12/2015 Liu .................. H01L 29/42364
257/77

* cited by examiner

METHOD AND STRUCTURE FOR ENABLING CONTROLLED SPACER RIE

BACKGROUND

The present application relates to semiconductor manufacturing, and more particularly to a method and structure to enable improved dielectric spacer reactive ion etch (RIE) endpoint detection.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs) is the next step in the evolution of complementary metal oxide semiconductor (CMOS) devices. Semiconductor fin field effect transistors (FETs) can achieve higher drive currents with increasingly smaller dimensions as compared to conventional planar FETs.

In the fabrication of FinFET devices, a controlled dielectric spacer pull down process is critical to enable source/drain epitaxy growth and prevent the formation of an epitaxial semiconductor nodule. Utilizing current technology, the control of a spacer pull down process is challenging because there is no reliable endpoint signal to detect. Moreover, the current processes for the removal of a dielectric spacer that is present on top of an insulator layer as well as on the sidewall surfaces of a semiconductor fin that extend upwards from the insulator layer do not provide enough of an endpoint detection signal change for reliable endpoint detection.

As such, there is a need for providing a method and structure to enable dielectric spacer endpoint detection that overcomes the problems associated with prior art processes of removing dielectric spacers during fabrication of finFET devices.

SUMMARY

A method and structure to enable reliable dielectric spacer endpoint detection by utilizing a sacrificial spacer fin are provided. The sacrificial spacer fin that is employed has a same pitch as the pitch of each semiconductor fin and the same height as the dielectric spacers on the sidewalls of each semiconductor fin. Exposed portions of the sacrificial spacer fin are removed simultaneously during a dielectric spacer reactive ion etch (RIE). The presence of the sacrificial spacer fin improves the endpoint detection of the spacer RIE and increases the endpoint signal intensity.

In one aspect of the present application, a method of forming a semiconductor structure is provided. In one embodiment of the present application, the method includes providing a plurality of semiconductor fins extending upwards from a surface of a substrate, and a plurality of sacrificial spacer fins extending upwards from another surface of the substrate. Next, a sacrificial gate structure is formed straddling over a portion of each semiconductor fin and each sacrificial spacer fin. A dielectric spacer material is then formed surrounding the sacrificial gate structure, wherein the dielectric spacer material and each sacrificial spacer fin comprise a same dielectric material. Next, a spacer reactive ion etch is performed to the dielectric spacer material to provide a dielectric spacer on sidewall surfaces of the sacrificial gate structure, wherein during the spacer reactive ion etch exposed portions of each sacrificial spacer fin are removed.

In another aspect of the present application, a semiconductor structure is provided. In one embodiment of the present application, the semiconductor structure includes a plurality of semiconductor fins extending upwards from a surface of a substrate, and a plurality of sacrificial spacer fin portions extending upwards from another surface of the substrate. A gate structure straddles over each semiconductor fin and each sacrificial spacer fin portion. A gate (i.e., dielectric) spacer surrounds the gate structure. Each sacrificial spacer fin portion is located entirely beneath a portion of the gate structure and a portion of the gate spacer.

DETAILED DESCRIPTION

Figure 1A:
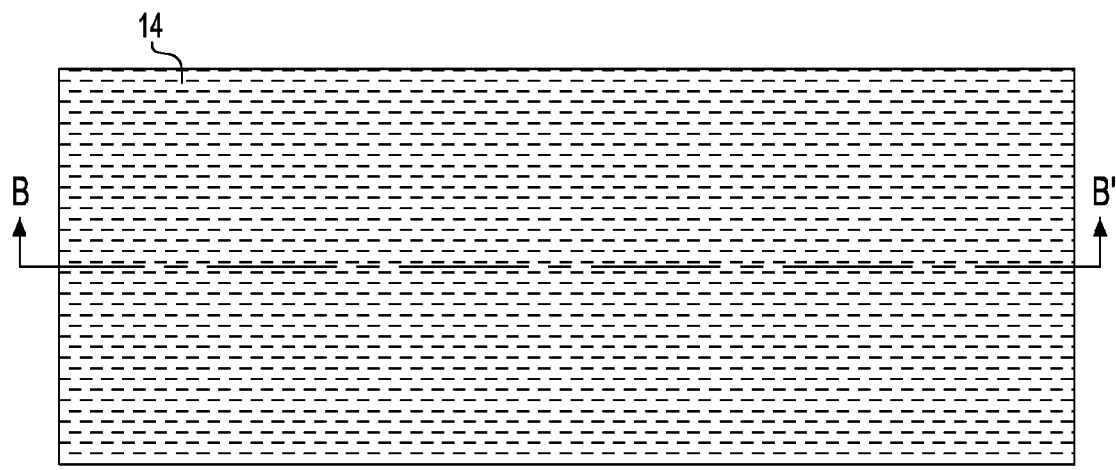
FIG. 1A is top-down view of an exemplary semiconductor structure including, from bottom to top, a handle substrate, an insulator layer and a semiconductor material layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1B:
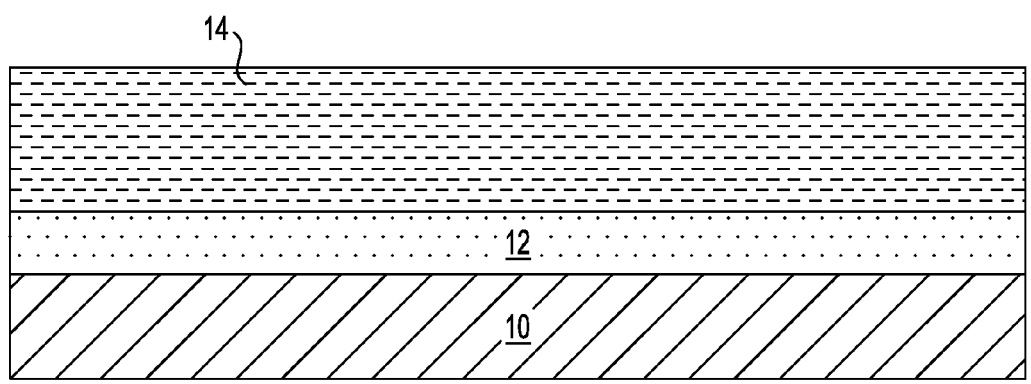
FIG. 1B is a cross-sectional view of the first exemplary semiconductor structure of FIG. 1A along the vertical plane B-B'.

Referring first to FIGS. 1A-1B, there are illustrated various views of an exemplary semiconductor structure including, from bottom to top, a handle substrate 10, an insulator layer 12 and a semiconductor material layer 14 that can be employed in accordance with an embodiment of the present application. Collectively, the handle substrate 10, the insulator layer 12 and the semiconductor material layer 14 may be referred to herein as a semiconductor-on-insulator (SOI) substrate. The handle substrate 10 provides mechanical support for the insulator layer 12 and the semiconductor material layer 14.

In some embodiments of the present application, the handle substrate 10 may comprise a semiconductor material. The term "semiconductor" as used herein in connection with the semiconductor material of the handle substrate 10 (or any other semiconductor material described herein) denotes any material that exhibits semiconductor properties including, for example, Si, Ge, SiGe, SiC, SiGeC, a II/VI compound semiconductor or a III/V compound semiconductor such as, for example, InAs, GaAs, or InP. In one embodiment, the handle substrate 10 may be comprised of silicon. In some embodiments, the handle substrate 10 is a non-semiconductor material including, for example, a dielectric material and/or a conductive material. In yet other embodiments, the handle substrate 10 can be omitted and a substrate including insulator layer 12 and the semiconductor material layer 14 can be used in the present application.

The semiconductor material layer 14 may comprise one of the semiconductor materials mentioned above for the handle substrate 10. In one embodiment, the semiconductor material layer 14 comprises a same semiconductor material as the handle substrate 10. In another embodiment, the semiconductor material layer 14 comprises a different semiconductor material than the handle substrate 10. In one embodiment, the semiconductor material layer 14 comprises silicon.

In some embodiments, the handle substrate 10 and the semiconductor material layer 14 may have a same crystal orientation. In other embodiments, the handle substrate 10 and the semiconductor material layer 14 may have different crystal orientations. The crystal orientation of the handle substrate 10 and/or the semiconductor material layer 14 may be {100}, {101}, or {111}. Other crystallographic orientations besides those specifically mentioned can also be used in the present application. The handle substrate 10 may be a single crystalline semiconductor material, a polycrystalline material, or an amorphous material. The semiconductor material layer 14 is typically comprised of a single crystalline semiconductor material such as, for example, single crystalline silicon.

The insulator layer 12 of the exemplary semiconductor structure shown in FIGS. 1A-1B may be a crystalline or non-crystalline oxide and/or nitride. In one embodiment, the insulator layer 12 is an oxide such as, for example, silicon dioxide. In another embodiment, the insulator layer 12 is a nitride such as, for example, silicon nitride or boron nitride. In yet still another embodiment of the present application, the insulator layer 12 may be a multilayered structure such as a stack of, in any order, silicon dioxide and boron nitride.

The exemplary semiconductor structure including the handle substrate 10, the insulator layer 12, and the semiconductor material layer 14 may be formed utilizing standard processes known in the art. In one example, the exemplary semiconductor structure shown in FIGS. 1A-1B may be formed by SIMOX (Separation by IMplantation of OXygen). In another example, a layer transfer process including wafer bonding may be used to provide the exemplary semiconductor structure shown in FIGS. 1A-1B.

The thickness of the semiconductor material layer 14 that can be used in the present application can be from 10 nm to 150 nm. Other thicknesses that are lesser than, or greater than, the aforementioned range can also be employed in the present application as the thickness of the semiconductor material layer 14. The thickness of the insulator layer 12 that may be used in the present application can be from 10 nm to 200 nm. Other thicknesses that are lesser than, or greater than, the aforementioned thickness range for the insulator layer 12 can also be used in the present application. The thickness of the handle substrate 10 of the exemplary semiconductor structure shown in FIGS. 1A-1B is inconsequential to the present application.

In some embodiments, the exemplary semiconductor structure shown in FIGS. 1A-1B may a bulk semiconductor substrate. By "bulk" it is meant that the entirety of the exemplary semiconductor structure shown in FIGS. 1A-1B comprises one or more semiconductor materials as defined above for handle substrate 10.

Figure 2A:
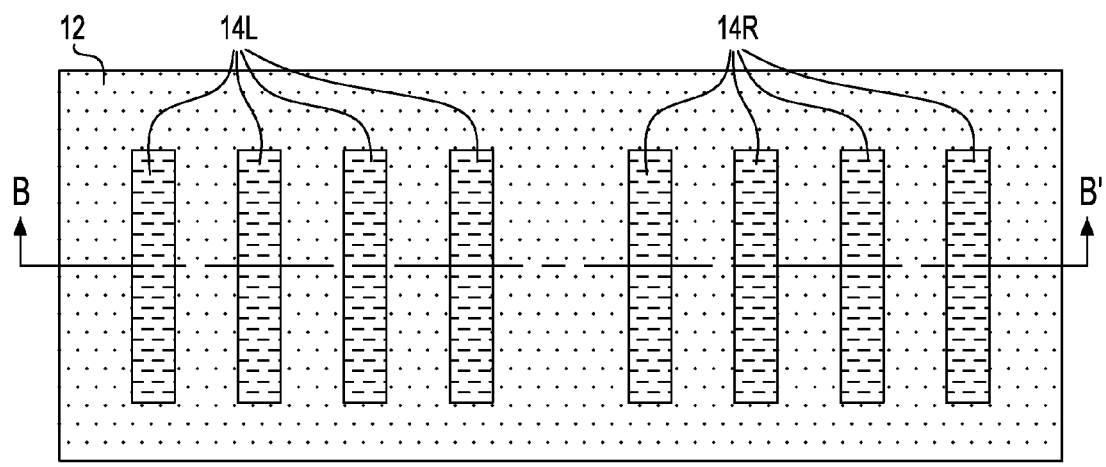
FIG. 2A is a top-down view of the exemplary semiconductor structure of FIGS. 1A-1B after forming a plurality of semiconductor fins, i.e., a first set of semiconductor fins and a second set of semiconductor fins, extending upwards from a surface of the insulator layer.
Figure 2B:
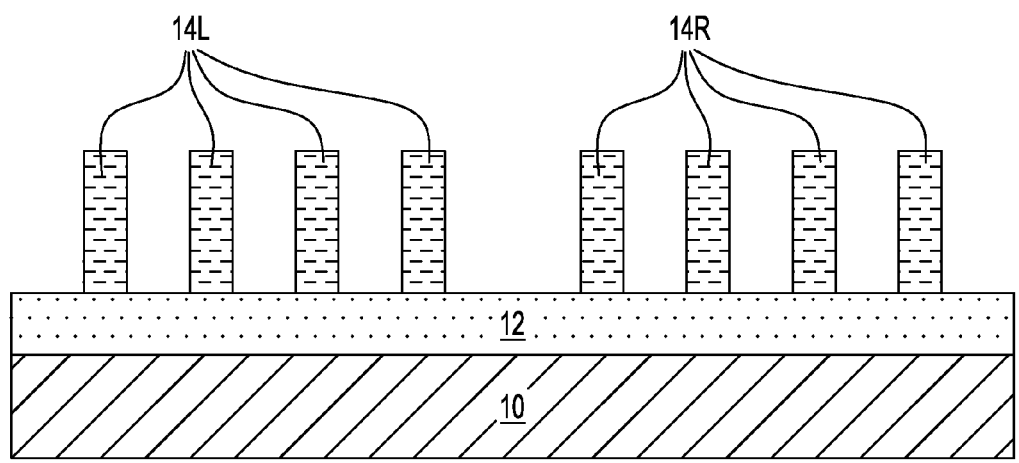
FIG. 2B is a cross-sectional view of the first exemplary semiconductor structure of FIG. 2A along the vertical plane B-B'.

Referring now to FIGS. 2A-2B, there are illustrated various views of the exemplary semiconductor structure of FIGS. 1A-1B after forming a plurality of semiconductor fins (14L, 14R) extending upwards from a surface of the insulator layer 12. In this embodiment, insulator layer 12 represents a substrate. In other embodiments in which a bulk semiconductor substrate is used, a remaining portion of the bulk substrate serves as a substrate in which the plurality of semiconductor fins extend from. The plurality of semiconductor fins (14L, 14R) can be formed by patterning the semiconductor material layer 14 of the SOI substrate shown in FIGS. 1A-1B. Alternatively, and when a bulk semiconductor substrate is employed as the exemplary semiconductor structure of FIGS. 1A-1B, a topmost semiconductor material of a bulk semiconductor substrate can be subjected to a patterning process.

In the drawings, semiconductor fins labeled as 14L represent a first set of semiconductor fins that is present in a first area of the structure, while semiconductor fins 14R represent a second set of semiconductor fins that is present in a second area of the structure. The first area of the structure containing the first set of semiconductor fins 14L is within a FinFET device region of the structure, while the second area of the structure containing the second set of semiconductor fins 14R is within a fill/Kerf region of the structure. The Kerf (or fill) region is an area of the structure in which active devices are not formed.

In one embodiment of the present application, the patterning process comprises a sidewall image transfer (SIT) process. The SIT process includes forming a contiguous mandrel material layer (not shown) on a topmost surface of either the bulk semiconductor substrate described above or the semiconductor material layer 14 of the SOI substrate described above. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers partially through an upper semiconductor material portion of the bulk semiconductor substrate, or entirely through the semiconductor material layer 14 of the SOI substrate and stopping on the insulator layer 12. The pattern transfer may be achieved by utilizing at least one etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In another embodiment, the patterning process can include lithography and etching. Lithography includes forming a photoresist material (not shown) on a topmost surface of either the bulk semiconductor substrate described above or the semiconductor material layer 14 of the SOI substrate described above. The photoresist material can be formed utilizing a deposition process such as, for example, spin-on coating, evaporation, or chemical vapor deposition. Following the deposition of the photoresist material, the photoresist material is exposed to a pattern of irradiation, and thereafter the exposed resist material is developed utilizing a conventional resist developer to provide a patterned photoresist material. At least one etch as mentioned above for the SIT process can be used here to complete the pattern transfer. Following at least one pattern transfer etch process, the patterned photoresist material can be removed from the structure utilizing a conventional resist stripping process such as, for example, ashing.

Each semiconductor fin (14L, 14R) that is formed includes a pair of vertical sidewalls that are parallel to each other. As used herein, a surface is "vertical" if there exists a vertical plane from which the surface does not deviate by more than three times the root mean square roughness of the surface. In one embodiment of the present application, each semiconductor fin (14L, 14R) that is formed has a height from 10 nm to 150 nm, and a width from 5 nm to 30 nm. Other heights and widths that are lesser than, or greater than, the aforementioned ranges may also be used in the present application for each semiconductor fin (14L, 14R). When multiple semiconductor fins are present in a given area of the structure, each semiconductor fin (14L or 14R) is separated from its nearest neighboring semiconductor fin (14L or 14R) by a pitch that is from 20 nm to 60 nm; the pitch can be measured from a central portion of one semiconductor fin to a central portion of the nearest neighboring semiconductor fin. Each semiconductor fin (14L, 14R) includes one of the semiconductor materials mentioned above for the bulk semiconductor substrate or the semiconductor material layer 14 of the SOI substrate.

In some embodiments not shown, a local isolation structure can be formed at the footprint of each semiconductor fin at this point of the present application. The local isolation structure can be formed by deposition of a trench dielectric material such as, a trench dielectric oxide, and thereafter a recess etch may be used to provide the local isolation structure. In embodiments in which the local isolation structure is present, a local isolation structure is present adjacent each semiconductor fin.

Figure 3A:
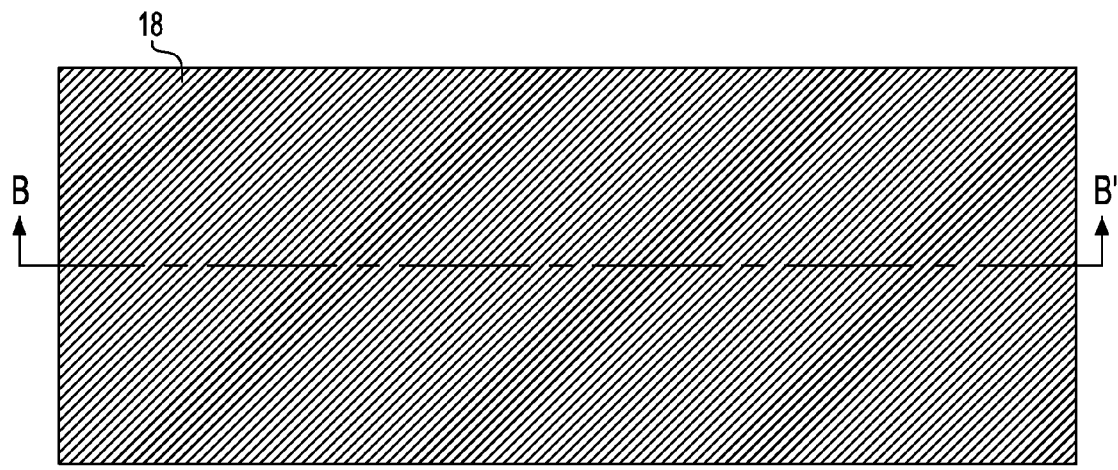
FIG. 3A is a top-down view of the exemplary semiconductor structure of FIGS. 2A-2B after forming a protective dielectric liner on exposed surfaces of each semiconductor fin and on exposed portions of the insulator layer.
Figure 3B:
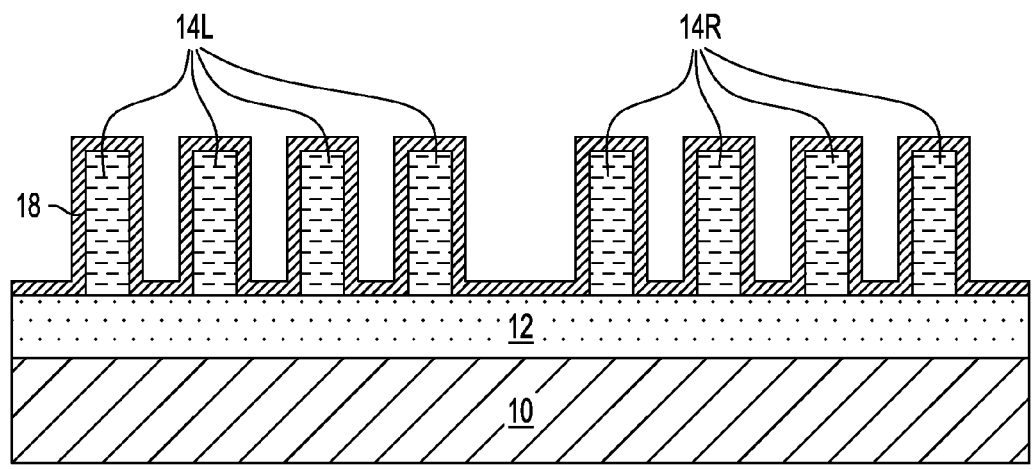
FIG. 3B is a cross-sectional view of the first exemplary semiconductor structure of FIG. 3A along the vertical plane B-B'.

Referring now to FIGS. 3A-3B, there are illustrated various views of the exemplary semiconductor structure of FIGS. 2A-2B after forming a protective dielectric liner 18 on exposed surfaces of each semiconductor fin (14L, 14R) and on exposed portions of the insulator layer 12; when a bulk semiconductor substrate is used, a portion of the protective dielectric liner 18 would be located on a remaining portion of the bulk semiconductor substrate. In some embodiments of the present application, the formation of the protective dielectric liner 18 can be omitted.

The protective dielectric liner 18 can be composed of an oxide, nitride and/or oxynitride. In one example, silicon dioxide is used for providing the protective dielectric liner 18. In some embodiments of the present application, the protective dielectric liner 18 can be formed by a deposition process including, for example, chemical vapor deposition, plasma enhanced chemical vapor deposition or physical vapor deposition. In other embodiments of the present application, the protective dielectric liner 18 can be formed by a thermal growth process such as, for example, oxidation.

The protective dielectric liner 18 is a conformal layer meaning that it has a thickness that is substantially the same (within ±0.5 nm) everywhere along an interface with each semiconductor fin (14L, 14R) and the surface of insulator layer 12. In one embodiment, the thickness of the protective dielectric liner 18 is from 10 nm to 50 nm. Other thicknesses are possible and are not excluded from being used in the present application.

Figure 4A:
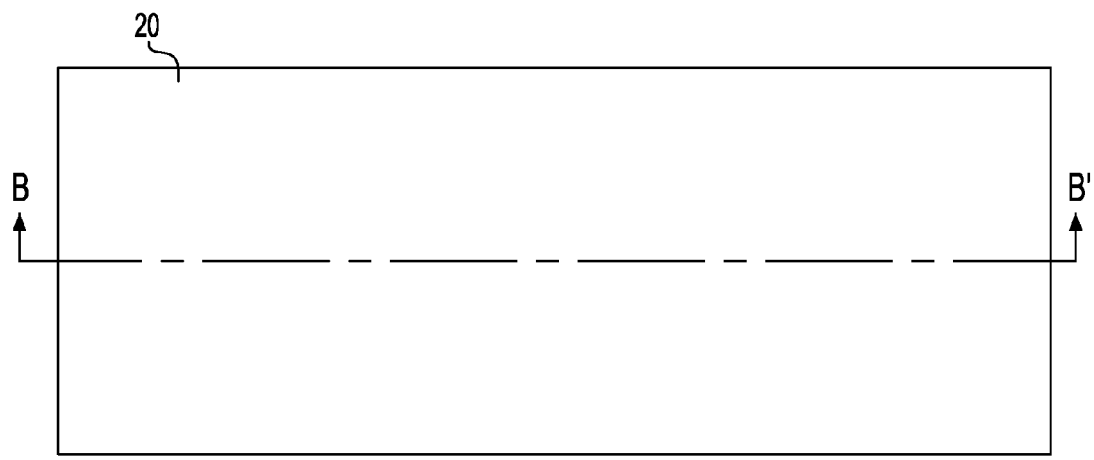
FIG. 4A is a top-down view of the exemplary semiconductor structure of FIGS. 3A-3B after forming a sacrificial dielectric material.
Figure 4B:
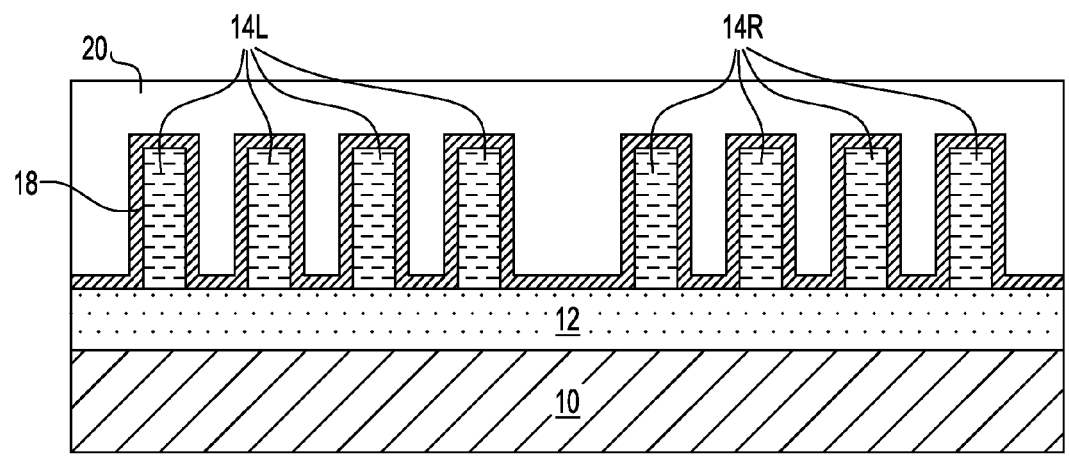
FIG. 4B is a cross-sectional view of the first exemplary semiconductor structure of FIG. 4A along the vertical plane B-B'.

Referring now to FIGS. 4A-4B, there are illustrated various views of the exemplary semiconductor structure of FIGS. 3A-3B after forming a sacrificial dielectric material 20. As is shown, the sacrificial dielectric material 20 fills the gaps located between each semiconductor fin (14L, 14R) and a portion of the sacrificial dielectric material 20 extends above a portion of the protective dielectric liner 18 that is present on a topmost surface of each semiconductor fin (14L, 14R).

The sacrificial dielectric material 20 may include one of the dielectric materials mentioned above for the protective dielectric liner 18. In one embodiment of the present application, the sacrificial dielectric material 20 and the protective dielectric liner 18 comprise a same semiconductor material. For example, the sacrificial dielectric material 20 and the protective dielectric liner 18 may both be comprised of silicon dioxide. In another embodiment of the present application, the sacrificial dielectric material 20 comprises a different dielectric material than the protective dielectric liner 18. For example, the sacrificial dielectric material 20 may comprise silicon dioxide, while the protective dielectric liner 18 comprises silicon oxynitride.

The sacrificial dielectric material 20 may be formed utilizing a deposition process including, for example, chemical vapor deposition or plasma enhanced chemical vapor deposition. The thickness of the sacrificial dielectric material 20 can be from 50 nm to 200 nm. Other thicknesses that are lesser than, or greater than, the aforementioned thickness range may also be employed as the thickness of the sacrificial dielectric material 20.

Figure 5A:
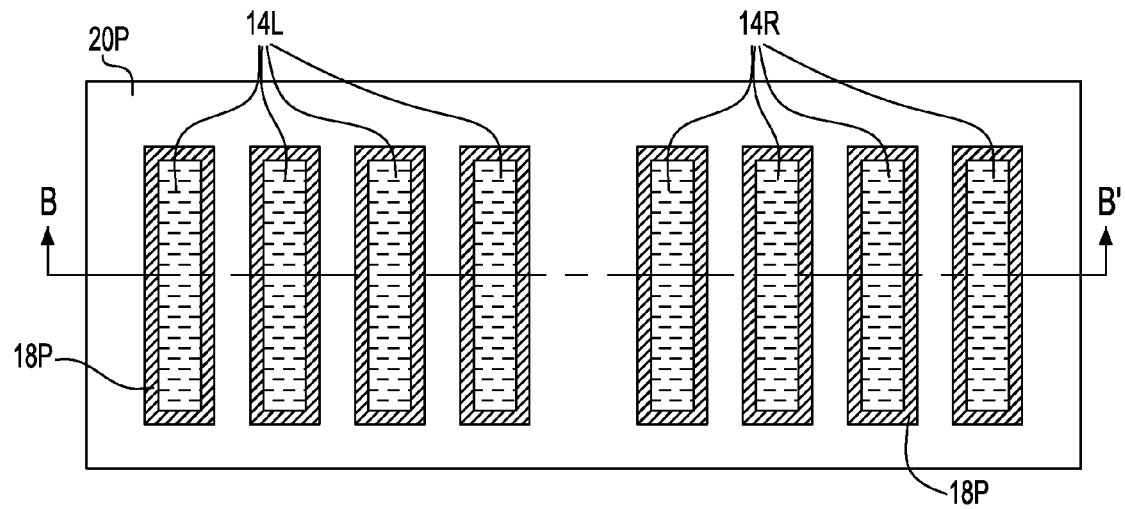
FIG. 5A is a top-down view of the exemplary semiconductor structure of FIGS. 4A-4B after removing an upper portion of the sacrificial dielectric material and a portion of the protective dielectric liner to expose a topmost surface of each semiconductor fin.
Figure 5B:
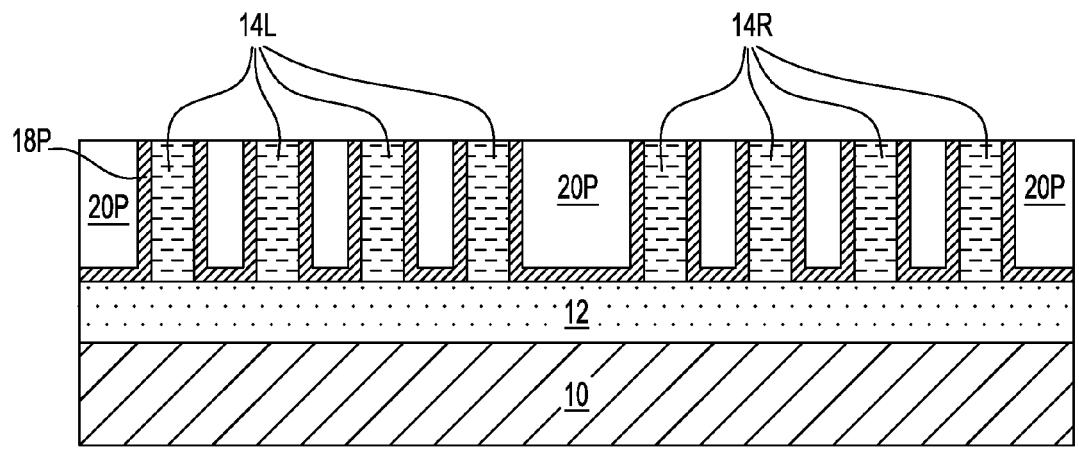
FIG. 5B is a cross-sectional view of the exemplary semiconductor structure of FIG. 5A along the vertical plane B-B'.

Referring now to FIGS. 5A-5B, there are illustrated various views of the exemplary semiconductor structure of FIGS. 4A-4B after removing an upper portion of the sacrificial dielectric material 20 and a portion (i.e., topmost horizontal portion) of the protective dielectric liner 18 to expose a topmost surface of each semiconductor fin (14L, 14R). Each remaining portion of the sacrificial dielectric material 20 may be referred herein as sacrificial dielectric material portion 20P, and each remaining portion of the protective dielectric liner 18 may be referred herein as protective dielectric liner portion 18P.

In one embodiment, the removal of the upper portion of the sacrificial dielectric material 20 and the topmost horizontal portion of the protective dielectric liner 18 may include a planarization process such, as for example, chemical mechanical polishing or grinding. In another embodiment, the removal of the upper portion of the sacrificial dielectric material 20 and the topmost horizontal portion of the protective dielectric liner 18 may include one or more etch back processes. In yet a further embodiment of the present application, a planarization process, followed by an etch back process can be used to remove the upper portion of the sacrificial dielectric material 20 and the topmost horizontal portion of the protective dielectric liner 18.

As is shown in FIGS. 5A-5B, the topmost surface of each semiconductor fin (14L, 14R) is now exposed. As is further shown, the topmost surface of each semiconductor fin (14L, 14R) is coplanar with a topmost surface of each sacrificial dielectric material portion 20P and a topmost surface of each protective dielectric liner portion 18P. As is further shown, each protective dielectric liner portion 18P is U-shaped. By "U-shaped" it is meant a structure having a base in which a vertical portion extends upward from each end portion of the base. Each sacrificial dielectric portion 20P is located within the volume of a U-shaped protective dielectric liner portion 18P.

Figure 6A:
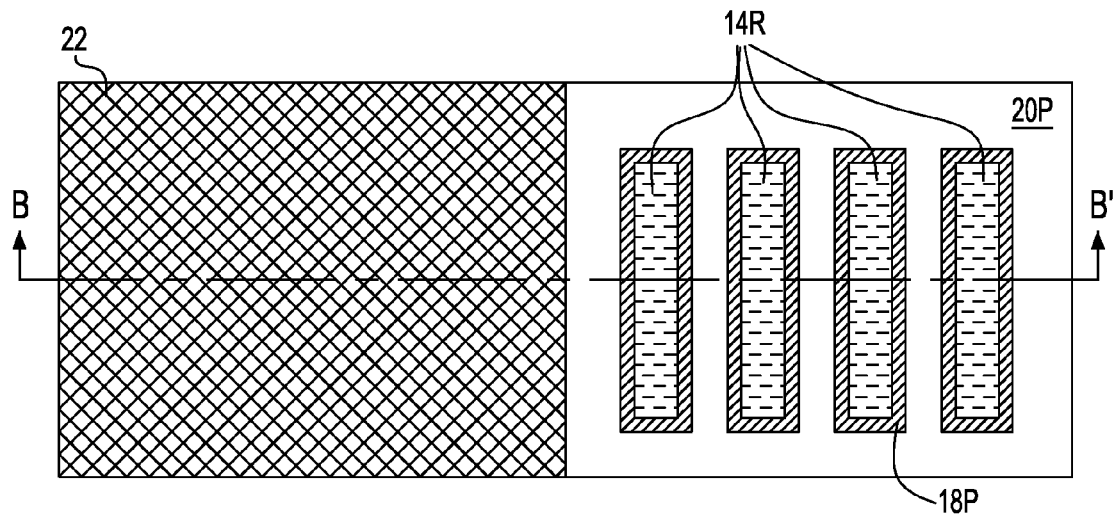
FIG. 6A is a top-down view of the exemplary semiconductor structure of FIGS. 5A-5B after forming a block mask structure over the first set of semiconductor fins, while leaving the second set of semiconductor fins exposed.
Figure 6B:
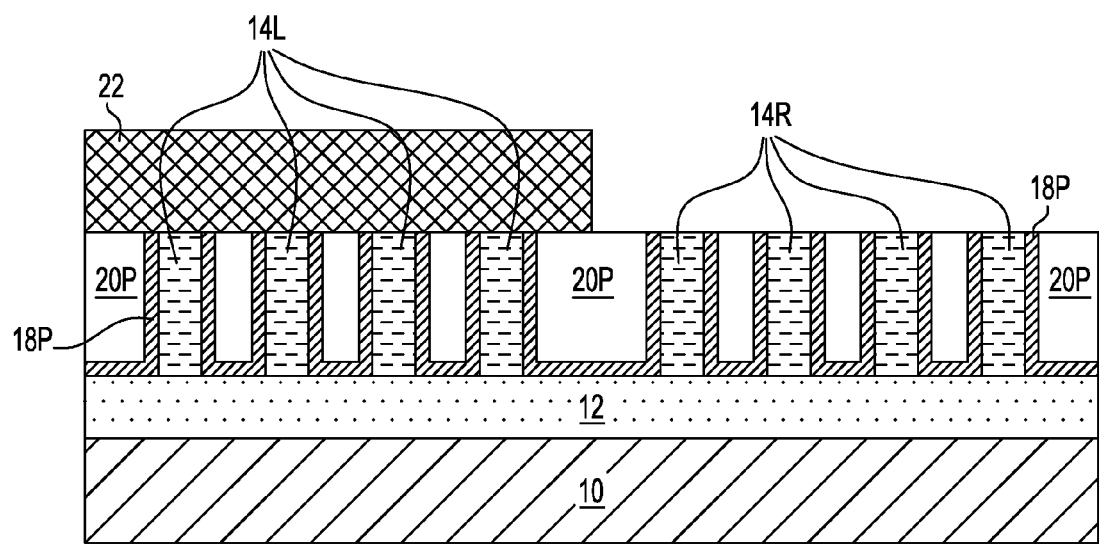
FIG. 6B is a cross-sectional view of the exemplary semiconductor structure of FIG. 6A along the vertical plane B-B'.

Referring now to FIGS. 6A-6B, there are illustrated various views of the exemplary semiconductor structure of FIGS. 5A-5B after forming a block mask structure 22 over the first set of the semiconductor fins 14L, while leaving the second set of semiconductor fins 14R exposed.

In one embodiment of the present application, the block mask structure 22 may be composed of only a photoresist material. In another embodiment, the block mask structure 22 may be composed of only a hard mask material. Examples of hard mask materials that can be used as block mask structure 22 include silicon dioxide, silicon nitride and/or silicon oxynitride. In another embodiment of the present application, the block mask structure 22 may comprise a stack of, from bottom to top, a hard mask material and a photoresist material.

In regard to the block mask structures disclosed in the proceeding paragraph, such block mask structures can be formed utilizing techniques that are well known to those skilled in the art. For example, the block mask structure 22 can be formed by first depositing at least one of the above mentioned materials and then patterning the at least one deposited material by lithography. An anisotropic etching process such as, for example, reactive ion etching can also be used to complete any pattern transfer that may be needed; for example, an anisotropic etch may be used to transfer a pattern from a lithographically defined photoresist into the underlying material that may define the block mask structure 22.

In yet other embodiments of the present application, the block mask structure 22 may include, a trilayer structure including from bottom to top, an optical planarization layer (OPL) portion, an antireflective coating (ARC) portion, and a photoresist material portion (all not individually shown). In such an embodiment, the OPL portion may comprise a self-planarizing material. In one example, the OPL portion can be an organic material including C, O, and H, and optionally including Si and/or F. In another example, the OPL portion can be amorphous carbon. The self-planarizating material that can provide the OPL portion can be formed by spin-on coating, chemical vapor deposition, plasma enhanced chemical vapor deposition, evaporation or chemical solution deposition. The thickness of the OPL portion can be from 10 nm to 300 nm, although lesser and greater thicknesses can also be employed.

The ARC portion comprises any antireflective coating material that can reduce image distortions associated with reflections off the surface of underlying structure. In one example, the ARC portion comprises a silicon (Si)-containing antireflective coating material. The antireflective coating material that provides the ARC portion can be formed by spin-on coating, chemical vapor deposition, plasma enhanced chemical vapor deposition, evaporation or chemical solution deposition. The thickness of the ARC portion can be from 10 nm to 150 nm, although lesser and greater thicknesses can also be employed.

When employed as the block mask structure 22, the trilayer structure described above can be formed by first providing a material stack of, from bottom to top, a blanket layer of self-planarizing material (as defined above), a blanket layer of antireflective coating material (as defined above) and a blanket layer of a photoresist material. The blanket layer of self-planarizing material and the blanket layer of antireflective coating material can be formed utilizing one of the deposition processes mentioned above. The photoresist material that may provide the blanket layer of photoresist material may comprise a positive-tone photoresist, a negative tone-resist or a hybrid photoresist material. The blanket layer of photoresist material may be deposited utilizing one of the deposition processes mentioned above in providing the antireflective coating material. After providing such a material stack, the material stack is then patterned by lithography and etching both of which have been described above.

Figure 7A:
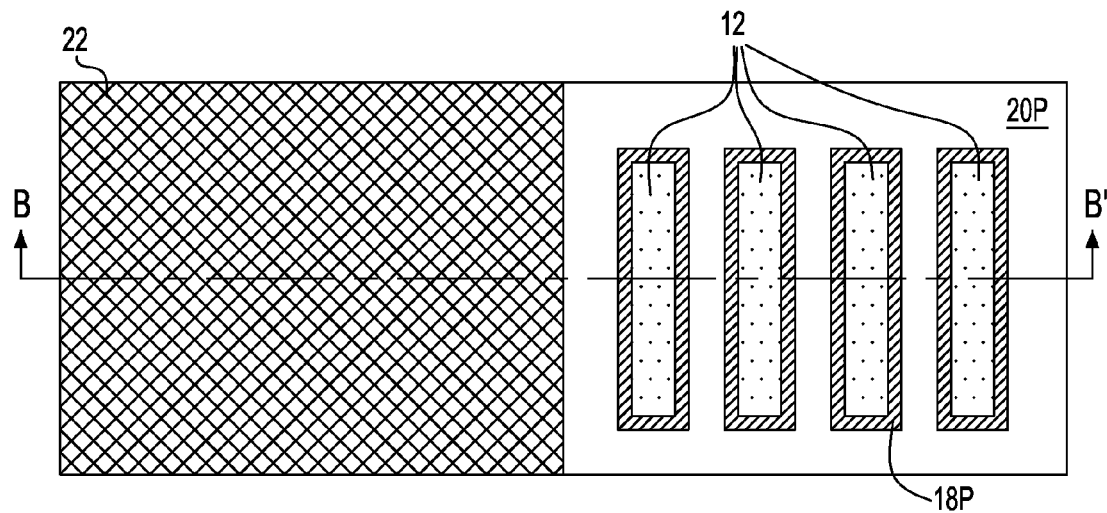
FIG. 7A is a top-down view of the exemplary semiconductor structure of FIGS. 6A-6B after removing each semiconductor fin of the second set of semiconductor fins.
Figure 7B:
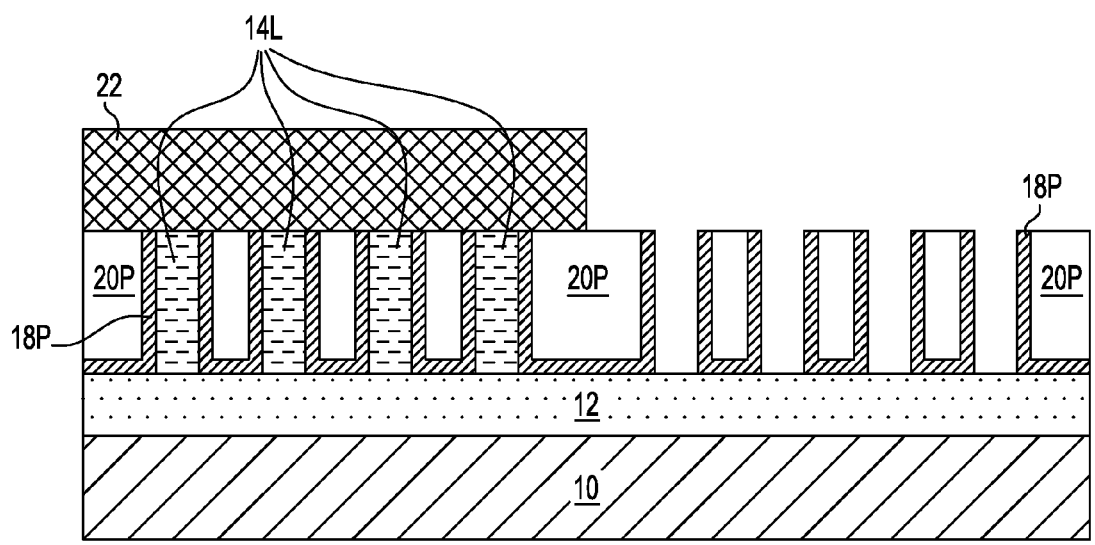
FIG. 7B is a cross-sectional view of the exemplary semiconductor structure of FIG. 7A along the vertical plane B-B'.

Referring now to FIGS. 7A-7B, there are illustrated various views of the exemplary semiconductor structure of FIGS. 6A-6B after removing each semiconductor fin of the second set of semiconductor fins 14R. The removal of each semiconductor fin of the second set of semiconductor fins 14R can be performed utilizing an anisotropic etching process that is selective in removing the semiconductor material that provides each semiconductor fin of the second set of semiconductor fins 14R. In one example, a reactive ion etch can be used to remove each semiconductor fin of the second set of semiconductor fins 14R. The removal of each semiconductor fin of the second set of semiconductor fins 14R exposes portions of the insulator layer 12 within the fill/Kerf area of the structure.

Figure 8A:
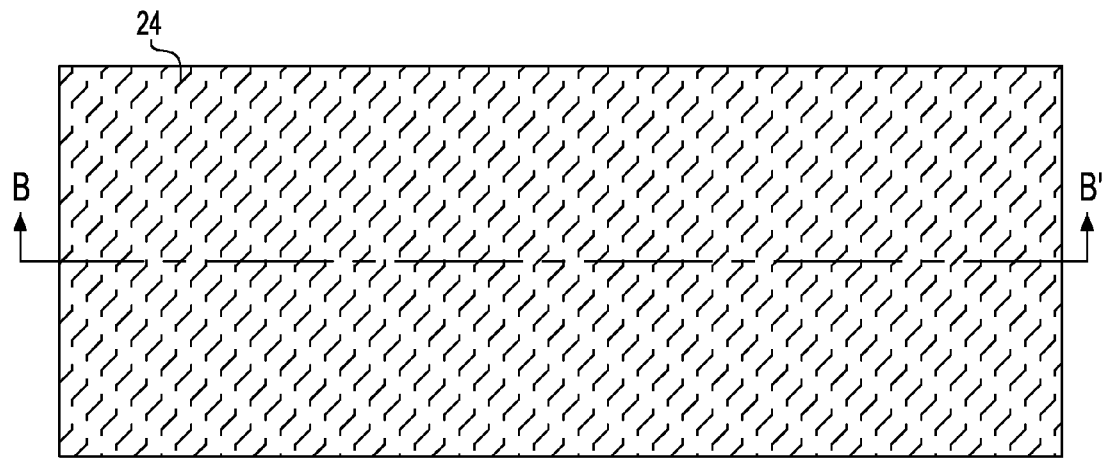
FIG. 8A is a top-down view of the exemplary semiconductor structure of FIGS. 7A-7B after removing the block mask structure and forming a sacrificial spacer material.
Figure 8B:
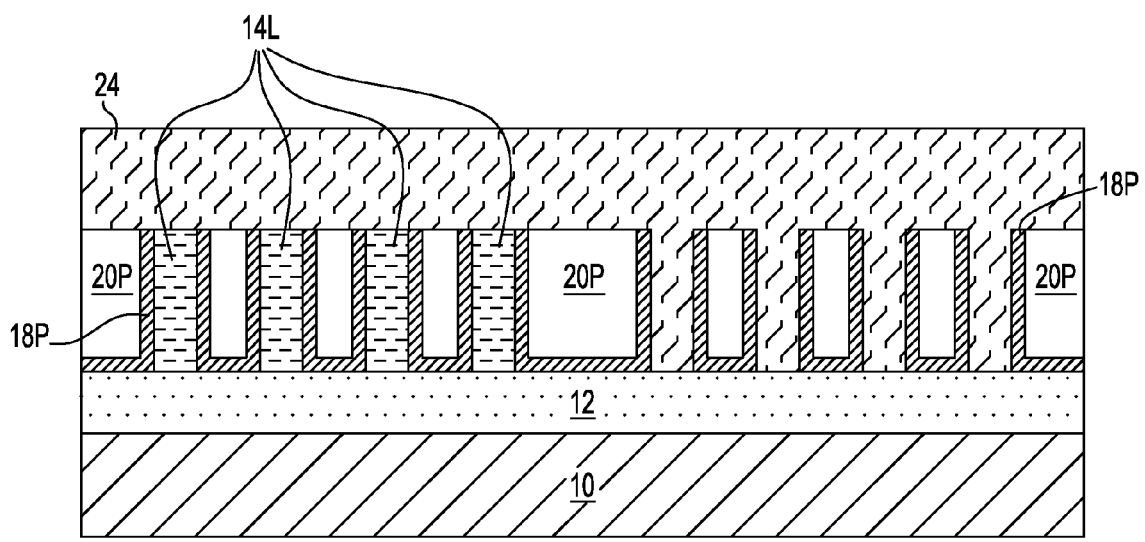
FIG. 8B is a cross-sectional view of the exemplary semiconductor structure of FIG. 8A along the vertical plane B-B'.

Referring now to FIGS. 8A-8B, there are illustrated various views of the exemplary semiconductor structure of FIGS. 7A-7B after removing the block mask structure 22 and forming a sacrificial spacer material 24. The removal of the block mask structure 22 may include any material removal process that is well known to those skilled in the art. This includes, but is not limited to, photoresist stripping, planarization, and/or etching.

After removing the block mask structure 22, the sacrificial spacer material 24 is formed. The sacrificial spacer material 24 comprises a dielectric material that has a different etch rate in a selective etchant as compared to both the protective dielectric liner 18 and the sacrificial dielectric material 20. In one embodiment of the present application, the sacrificial spacer material 24 comprises silicon nitride, while the protective dielectric liner 18 and the sacrificial dielectric material 20 comprise silicon dioxide. The sacrificial spacer material 24 can be formed utilizing any deposition process including, for example, chemical vapor deposition or plasma enhanced chemical vapor deposition. The thickness of the sacrificial spacer material 24 can be from 50 nm to 200 nm. Other thicknesses that are lesser than, or greater than, the aforementioned thickness range may also be employed as the thickness of the sacrificial spacer material 24.

As is shown, a portion of the sacrificial spacer material 24 extends above each semiconductor fin of the first set of semiconductor fins 14L that are in the FinFET device region. Within the fill/Kerf region, the sacrificial spacer material 24 fills in the volume that was previously occupied by the set second of semiconductor fins 14R. Also, and in the fill/Kerf region, the sacrificial spacer material 24 extends atop each sacrificial dielectric material portion 20P and each protective dielectric liner portion 18P.

Figure 9A:
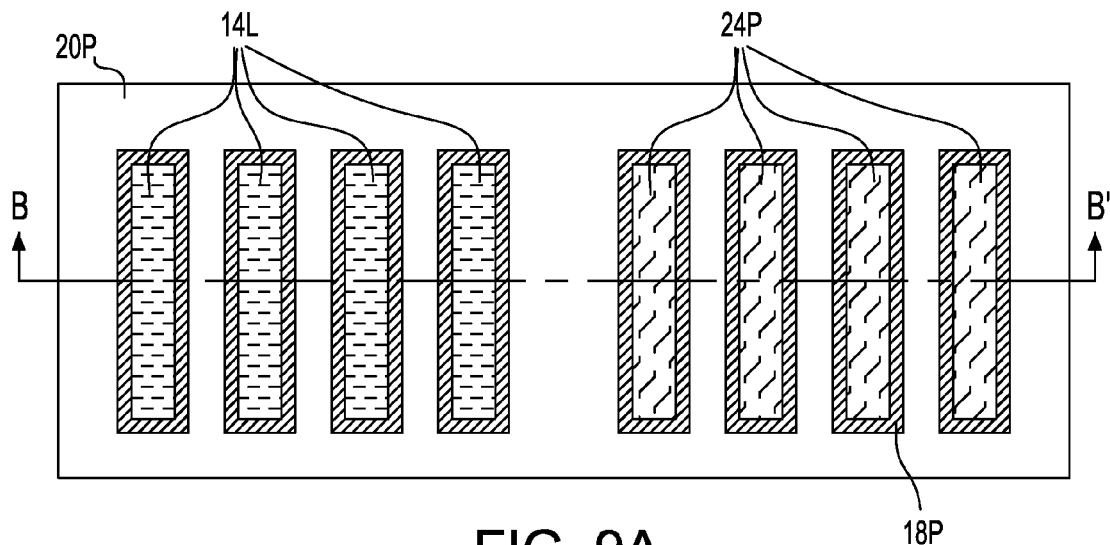
FIG. 9A is a top-down view of the exemplary semiconductor structure of FIGS. 8A-8B after removing an upper portion of the sacrificial spacer material to provide sacrificial spacer fins within an area previously occupied by the second set of semiconductor fins.
Figure 9B:
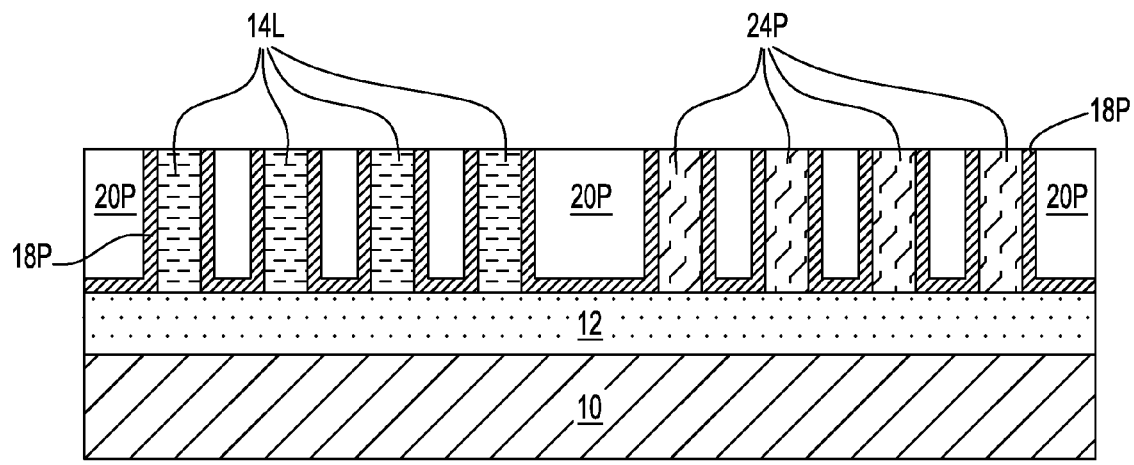
FIG. 9B is a cross-sectional view of the exemplary semiconductor structure of FIG. 9A along the vertical plane B-B'.

Referring now to FIGS. 9A-9B, there are illustrated various views of the exemplary semiconductor structure of FIGS. 8A-8B after removing an upper portion of the sacrificial spacer material 24 to provide sacrificial spacer fins 24P within the area previously occupied by the second set of semiconductor fins 14R.

In one embodiment, the removal of the upper portion of the sacrificial spacer material 24 may include a planarization process such, as for example, chemical mechanical polishing or grinding. In another embodiment, the removal of the upper portion of sacrificial spacer material 24 may include an etch back process.

As is shown in FIGS. 9A-9B, the topmost surface of each sacrificial spacer fin 24P is exposed. As is further shown, the topmost surface of each sacrificial spacer fin 24P is coplanar with a topmost surface of each semiconductor fin of the first set of semiconductor fins 14L, each sacrificial dielectric material portion 20P and a topmost surface of each protective dielectric liner portion 18P.

Figure 10A:
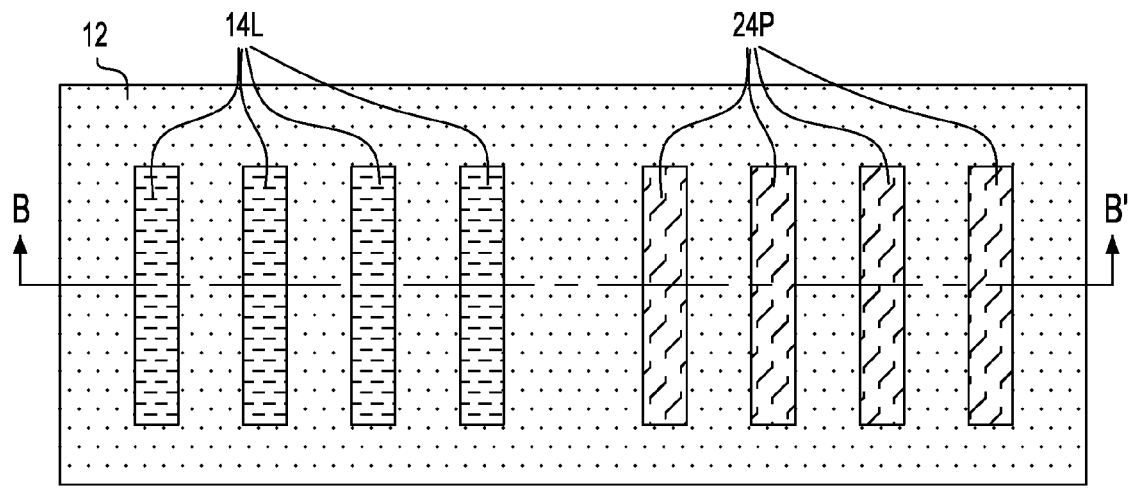
FIG. 10A is a top-down view of the exemplary semiconductor structure of FIGS. 9A-9B after removing remaining portions of the sacrificial dielectric material and remaining portions of the protective dielectric liner.
Figure 10B:
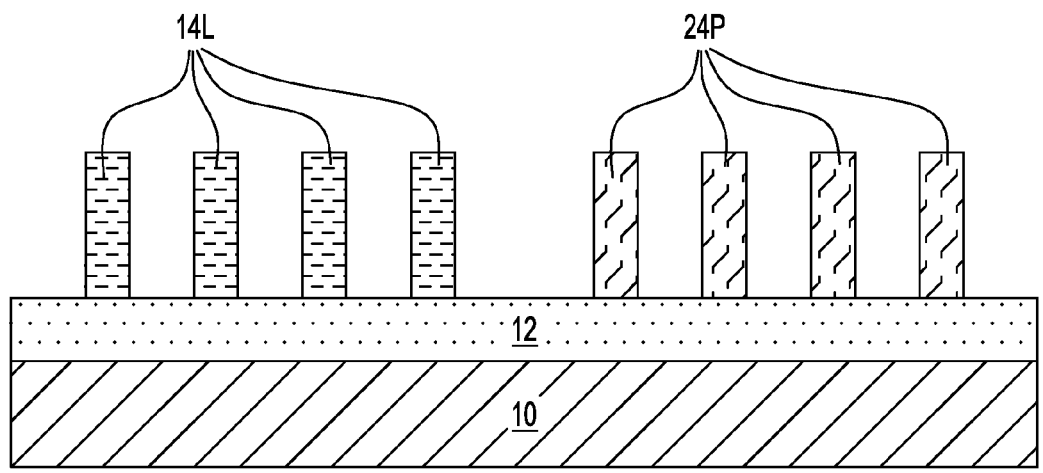
FIG. 10B is a cross-sectional view of the exemplary semiconductor structure of FIG. 10A along the vertical plane B-B'.

Referring now to FIGS. 10A-10B, there are illustrated various views of the exemplary semiconductor structure of FIGS. 9A-9B after removing remaining portions of the sacrificial dielectric material (i.e., sacrificial dielectric material portions 20P) and remaining portions of the protective dielectric liner (i.e., protective dielectric liner portions 18P). The removal of each sacrificial dielectric material portion 20P and each protective dielectric liner portion 18P can be performed utilizing one or more etching processes that is (are) selective in removing the dielectric material that provides the sacrificial dielectric material portions 20P and the protective dielectric liner portions 18P.

Upon removal of each sacrificial dielectric material portion 20P and each protective dielectric liner portion 18P, there is provided a structure that includes a plurality of semiconductor fins (represented by the first set of semiconductor fins 14L) extending upwards from a surface of insulator layer 12, and a plurality of sacrificial spacer fins 24P extending upwards from another surface of the insulator layer 12. Each semiconductor fin (i.e., the first set of semiconductor fins 14L) is present in the FinFET device region, while each sacrificial spacer fin 24P is present in the fill/Kerf region. Each semiconductor fin (i.e., the first set of semiconductor fins 14L) has a height and width that is the same as each sacrificial spacer fin 24P.

Figure 11A:
FIG. 11A is a top-down view of the exemplary semiconductor structure of FIGS. 10A-10B after forming another protective dielectric liner on exposed surfaces of each semiconductor fin of the first set of semiconductor fins, on exposed surfaces of each sacrificial spacer fin and on exposed portions of the insulator layer.
Figure 11B:
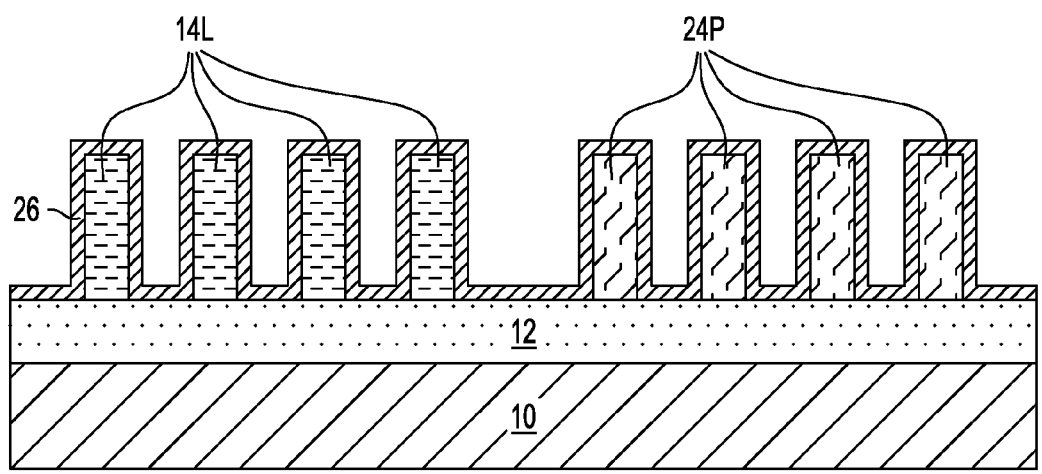
FIG. 11B is a cross-sectional view of the exemplary semiconductor structure of FIG. 11A along the vertical plane B-B'.

Referring now to FIGS. 11A-11B, there are shown various views of the exemplary semiconductor structure of FIGS. 10A-10B after forming another protective dielectric liner 26 on exposed surfaces of each semiconductor fin of the first set of semiconductor fins 14L, exposed surfaces of each sacrificial spacer fin 24P and on exposed portions of the insulator layer 12. In some embodiments of the present application, the formation of the another protective dielectric liner 26 may be omitted. The protective dielectric liner 18 mentioned above may represent a first protective dielectric liner, while the another protective dielectric liner 26 may represent a second protective dielectric liner.

Protective dielectric liner 26 may include one of the materials as mentioned above for protective dielectric liner 18. Also, protective dielectric liner 26 may be formed utilizing a deposition process as mentioned above in forming the protective dielectric liner 18. Protective dielectric liner 26 may also have a thickness within the thickness range mentioned above for protective dielectric liner 18.

Figure 12A:
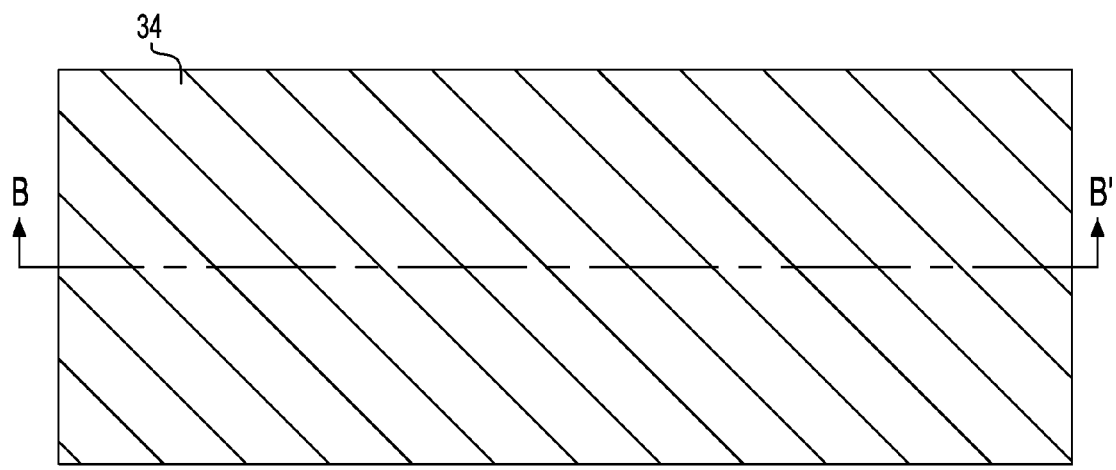
FIG. 12A is a top-down view of the exemplary semiconductor structure of FIGS. 10A-10B after forming a sacrificial gate material and a photoresist material.
Figure 12B:
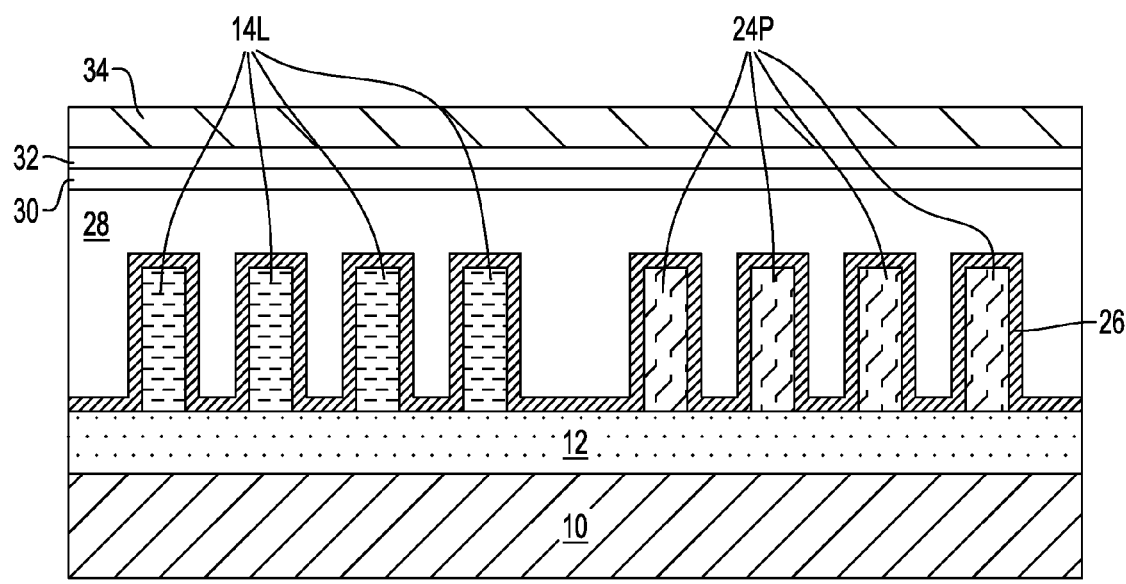
FIG. 12B is a cross-sectional view of the exemplary semiconductor structure of FIG. 12A along the vertical plane B-B'.

Referring now to FIGS. 12A-12B, there are illustrated various views of the exemplary semiconductor structure of FIGS. 11A-11B after forming a sacrificial gate material 28 and a photoresist material 34. In some embodiments, and as shown, a hard mask stack including a lower hard mask material layer 30 and an upper hard mask material layer 32 can be positioned between the sacrificial gate material 28 and the photoresist material 34.

The sacrificial gate material 28 can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the sacrificial gate material 28, and in some embodiments, the hard mask stack (30, 32) mentioned can be formed. The lower hard mask material layer 30 may comprise an oxide, nitride, or an oxynitride. In one example, the lower hard mask material layer 30 may be composed of silicon dioxide. The upper hard mask material layer 32 typically comprises a different material than the lower hard mask material layer 30. In one example, and when the lower hard mask material layer 30 is composed of silicon dioxide, the upper hard mask material layer 32 is composed of silicon nitride. The hard mask stack (30, 32) can be formed utilizing deposition processes well known to those skilled in the art.

The photoresist material 34 that can be employed in the present application may include any of the well known positive-tone photoresist compositions, negative-tone photoresist compositions or hybrid-tone photoresist compositions. The photoresist material 34 can be formed by a deposition process such as, for example, chemical vapor deposition or spin-on coating.

Figure 13A:
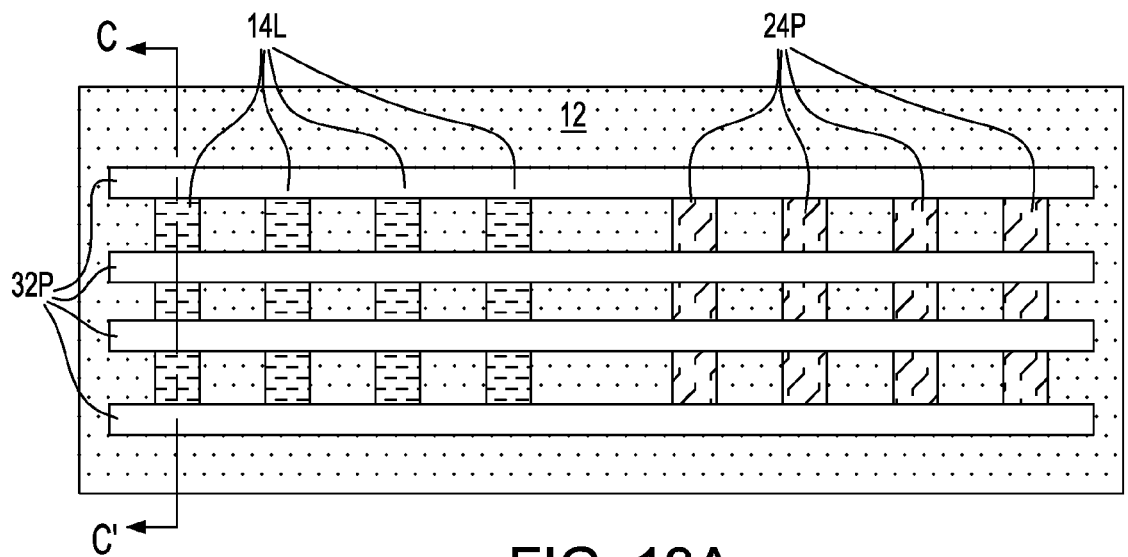
FIG. 13A is a top-down view of the exemplary semiconductor of FIGS. 12A-12B after forming sacrificial gate structures straddling over different portions of each semiconductor fin of the first set of semiconductor fins and each sacrificial spacer fin.
Figure 13B:
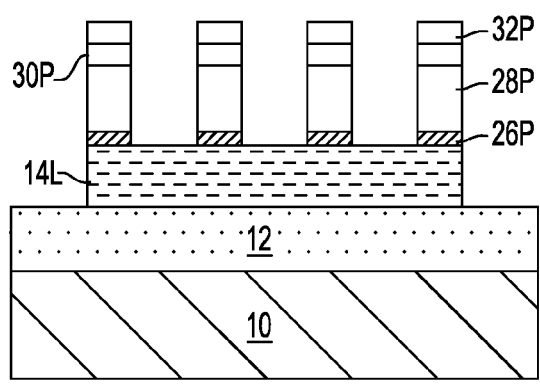
FIG. 13B is a cross-sectional view of the exemplary semiconductor structure of FIG. 13A along the vertical plane C-C'.

Referring now to FIGS. 13A-13B, there are illustrated various views of the exemplary semiconductor of FIGS. 12A-12B after forming sacrificial gate structures straddling over different portions of each semiconductor fin of the first set of semiconductor fins 14L and each sacrificial spacer fin 24P. Although a plurality of sacrificial gate structures is described and illustrated, the present application can work when only a single sacrificial gate structure is formed.

After sacrificial gate structure formation and as is shown, portions of each semiconductor fin of the first set of semiconductor fins 14L and each sacrificial spacer fin 24P are exposed. Although not seen in the top-view of FIG. 13A, portions of each semiconductor fin of the first set of semiconductor fins 14L and each sacrificial spacer fin 24P are located directly beneath each sacrificial gate structure. In some embodiments, and as shown, the another protective dielectric liner 26 can be patterned during this step of the present application. In yet another embodiment, the another protective dielectric liner 26 remains unpatterned after forming the sacrificial gate structure.

Each sacrificial gate structure includes, from bottom to top, a remaining portion of the sacrificial gate material 28, a remaining portion of the lower hard mask material layer 30, and a remaining portion of the upper hard mask material layer 32. In some embodiments, and as shown, the another protective dielectric liner 26 can be patterned during this step of the present application. The remaining portion of the another protective dielectric liner 26 can be referred to herein as another protective dielectric liner portion 26P. In yet another embodiment, the another protective dielectric liner 26 remains unpatterned after forming the sacrificial gate structure.

The remaining portion of the sacrificial gate material 28 can be referred to herein as a sacrificial gate material portion 28P. The remaining portion of the lower hard mask material layer 30 can be referred to herein as lower hard mask material portion 30P. The remaining portion of the upper hard mask material layer 32 can be referred to herein as upper hard mask material portion 32P. Within a particular sacrificial gate structure (28P, 30P, 32P), the sidewall surfaces of elements 28P, 30P and 32P are vertically coincident with each other. When the another protective dielectric liner 26 is patterned, the sidewall surfaces of the another protective dielectric liner portion 26P are vertically coincident to the sidewall surfaces of each of elements 28P, 30P and 32P.

Each sacrificial gate structures (28P, 30P, 32P) can be formed by lithography and etching of the exemplary semiconductor structure illustrated in FIGS. 12A-12B. The lithography step include exposing the photoresist material to a pattern of irradiation and then developing the exposed resist utilizing a conventional resist developer to provide a patterned photoresist material (not shown) atop a portion of the hard mask stack (30, 32). One or more anisotropic etching processes can be used to transfer the pattern from the patterned photoresist material into the underlying hard mask stack (30, 32) and then into the sacrificial gate material 28. In some embodiments, and when the protective dielectric liner 26 is patterned at this point of the present application, the pattern transfer etch continues into the underlying protective dielectric liner 26. The patterned photoresist material can be removed any time after the pattern has been transferred into at least the upper hard mask material layer 32 utilizing a conventional resist stripping process such as, for example, ashing.

It should be noted that the exemplary semiconductor structure shown in FIG. 13B represents one possible configuration. In the illustrated exemplary semiconductor structure of FIG. 13B, the outermost sacrificial gate structures (28P, 30P, 32P) are shown at the outermost edge of the semiconductor fin 14L. In other embodiments of the present application, the outermost sacrificial gate structures (28P, 30P, 32P) can be located inward from the outermost edge of the semiconductor fin 14L. In yet another embodiment, a portion of each outermost sacrificial gate structures (28P, 30P, 32P) can extend beyond the outermost edge of the semiconductor fin 14L and can be positioned on a surface of a previously formed local isolation structure.

Figure 14A:
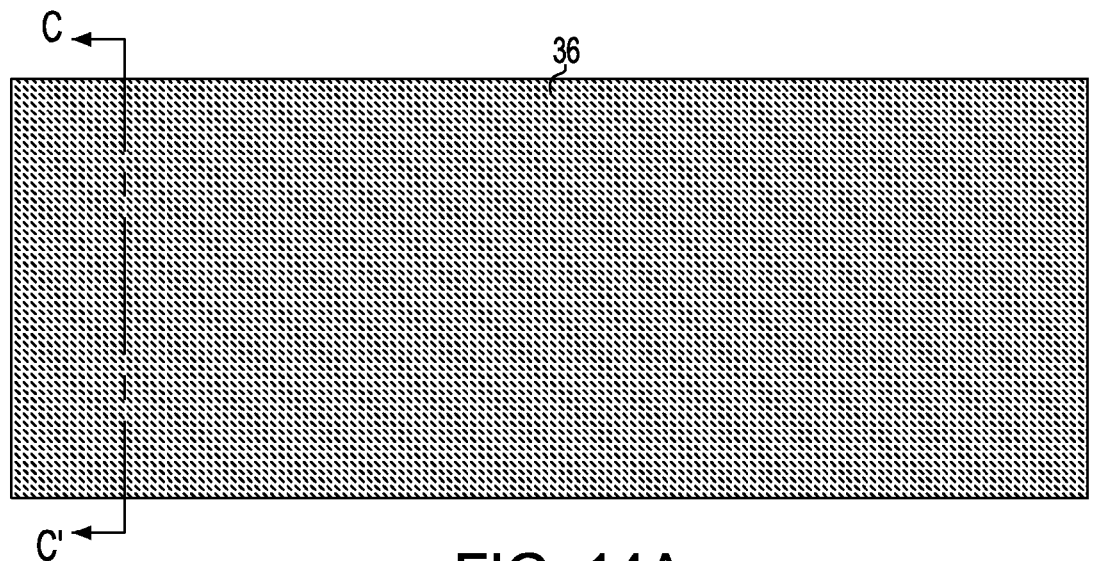
FIG. 14A is a top-down view of the exemplary semiconductor structure of FIGS. 13A-13B after forming a dielectric spacer material.
Figure 14B:
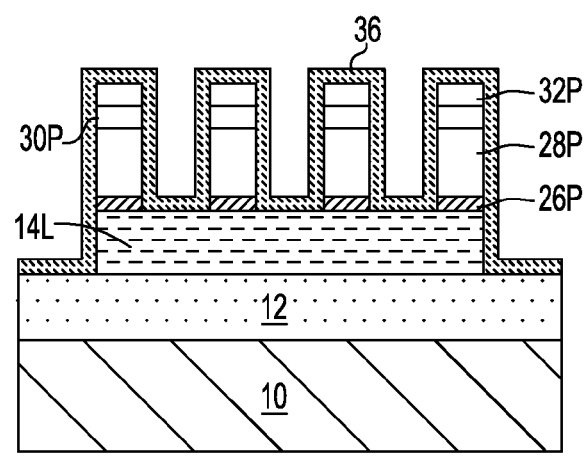
FIG. 14B is a cross-sectional view of the exemplary semiconductor structure of FIG. 14A along the vertical plane C-C'.

Referring now to FIGS. 14A-14B, there are illustrated various views of the exemplary semiconductor structure of FIGS. 13A-13B after forming a dielectric spacer material 36. Dielectric spacer material 36 comprises a dielectric material that is the same as the dielectric material than provides each sacrificial spacer fin 24P. In one example, the dielectric spacer material 36 and each sacrificial spacer fin 24P comprise silicon nitride.

The dielectric spacer material 36 can be formed by a deposition process including, for example, chemical vapor deposition, plasma enhanced chemical vapor deposition or physical vapor deposition. The dielectric spacer material 36 is a conformal layer whose thickness can be from 5 nm to 30 nm. Other thicknesses are possible and are not excluded from being used in the present application.

Figure 15A:
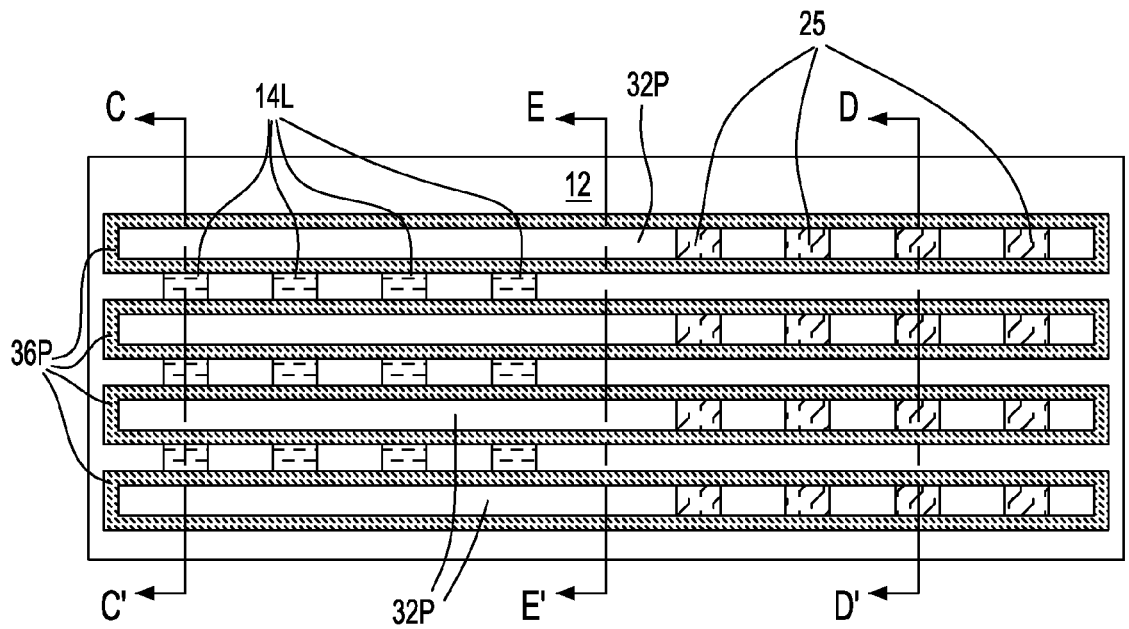
FIG. 15A is a top-down view of the exemplary semiconductor structure of FIGS. 14A-14B after performing a spacer reactive ion (RIE) etch.
Figure 15B:
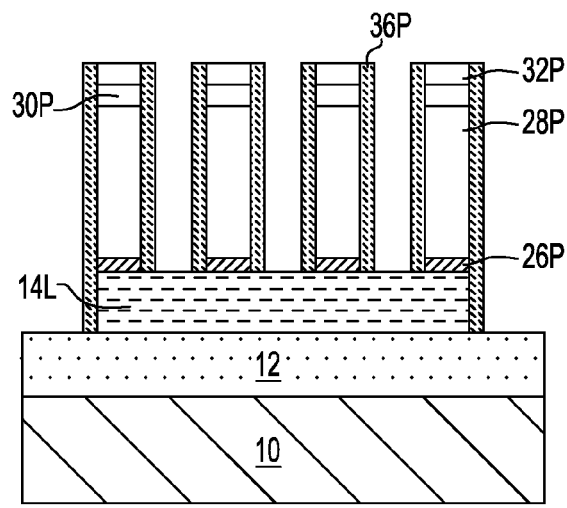
FIG. 15B is a cross-sectional view of the exemplary semiconductor structure of FIG. 15A along the vertical plane C-C'.
Figure 15C:
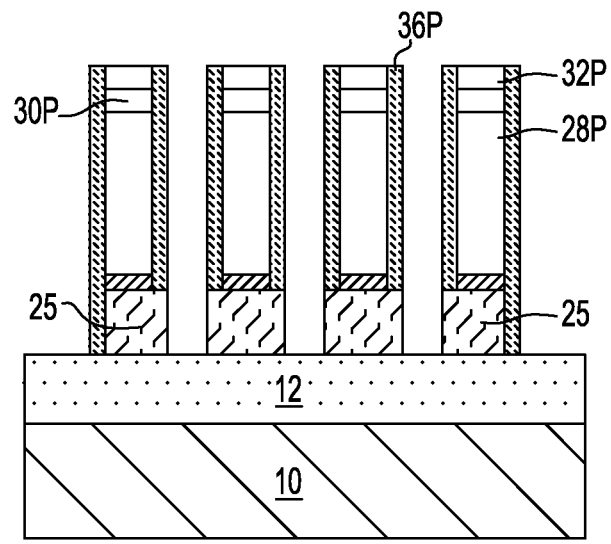
FIG. 15C is a cross-sectional view of the exemplary semiconductor structure of FIG. 15A along the vertical plane D-D'.
Figure 15D:
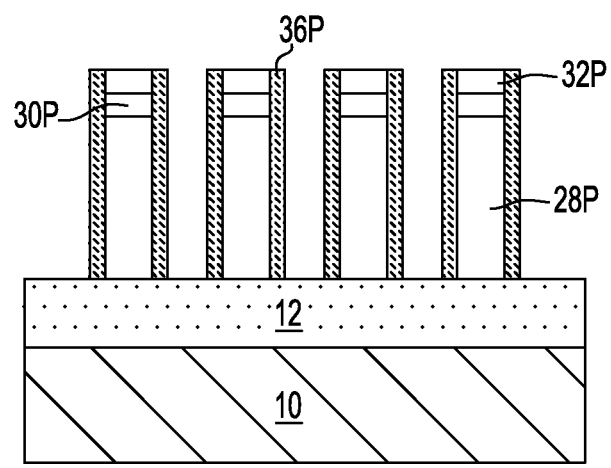
FIG. 15D is a cross-sectional view of the exemplary semiconductor structure of FIG. 15A along the vertical plane E-E'.

Referring now to FIGS. 15A-15D, there are illustrated various views of the exemplary semiconductor structure of FIGS. 14A-14B after performing a spacer reactive ion (RIE) etch. The spacer RIE forms a dielectric spacer 36P that surrounds each sacrificial gate structure (28P, 30P, 32P); dielectric spacer 36P may also be referred to as a gate spacer. Also, and during the spacer RIE, the exposed portions of each sacrificial spacer fin 24P are removed. Portions of each sacrificial spacer fin 24P remain under each sacrificial gate structure (28P, 30P, 32P) as well as a portion of the newly formed dielectric spacer 36P. Each remaining portion of sacrificial spacer fin can be referred to herein as a sacrificial spacer fin portion 25. In FIG. 15A, the remaining portions of each sacrificial spacer fin 24P are shown for illustrative purposes only; in reality one would not see the remaining portions of each sacrificial spacer fin 24P (i.e., sacrificial spacer fin portions 25) that is present beneath the sacrificial gate structures (28P, 30P, 32P). Although not shown in the top down view of FIG. 15A, a portion of each semiconductor fin 14L that is present in a first area of the structure is located beneath the sacrificial gate structure (28P, 30P, 32P) and well as the dielectric spacer 26P. In the present application, each semiconductor fin of the first set of semiconductor fins 14L has a height and width that is the same as each sacrificial spacer fin portion 25.

It is noted that the presence of the sacrificial spacer fin 24P in the exemplary semiconductor structure of the present application increases the endpoint signal intensity of the RIE process thus providing an enhanced (i.e., greater signal intensity) endpoint signal that can be reliably detected over the same structure that does not include the sacrificial spacer fins 24P. Thus, the presence of the sacrificial spacer fin 24P in the exemplary semiconductor structure of the present application improves the accuracy of the spacer RIE such that there is sufficient space in the FinFET device region for subsequently forming source/drain structures by epitaxial growth of a semiconductor material.

Although not illustrated in the drawings, source/drain structures can be formed after performing the spacer RIE mentioned above. The source/drain structures (not shown) would be epitaxially grown on the exposed surfaces of each semiconductor fin of the first set of semiconductor fins 14L that are not covered by the dielectric spacer 36P and the sacrificial gate structure. If not previously done, the another protective dielectric liner 26 can be removed from the semiconductor fins 14L at this point of the present application by etching. As is known to those skilled in the art, a source structure would be located on one side of the sacrificial gate structure, while a drain structure would be located on another side of the sacrificial gate structure. The source/drain structures of each individual semiconductor fin 14L may be unmerged or merged. The source/drain structures typically have a height that is greater than a height of the semiconductor fins 14L.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In the present application, each source/drain structure has an epitaxial relationship, i.e., same crystal orientation, as that of the semiconductor fins 14L.

Examples of various epitaxial growth processes that are suitable for use in forming the source/drain structures include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). The temperature for epitaxial deposition typically ranges from 250° C. to 900° C. Although higher temperature typically results in faster deposition, the faster deposition may result in crystal defects and film cracking. A number of different source gases may be used for the deposition of the source/drain structures. In some embodiments, the source gas for the deposition of a silicon source/drain structure includes a silicon containing gas source such as, for example, a silane. When a silicon germanium alloy is used as the semiconductor material of the source/drain structures, a silicon containing gas source and a separate germanium containing gas source may be used. Carrier gases like hydrogen, nitrogen, helium and argon can be used.

The semiconductor material that provides the source/drain structures is doped with an n-type dopant or a p-type dopant as are well known those skilled in the art. The doping may be achieved during the epitaxial growth of the semiconductor material that provides the source/drain structures or after epitaxial growth of an intrinsic semiconductor material by utilizing ion implantation or gas phase doping.

The term "p-type" refers to the addition of impurities to an intrinsic semiconductor that creates deficiencies of valence electrons. In a silicon-containing substrate, examples of p-type dopants, i.e., impurities, include, but are not limited to, boron, aluminum, gallium and indium. "N-type" refers to the addition of impurities that contributes free electrons to an intrinsic semiconductor. In a silicon containing substrate, examples of n-type dopants, i.e., impurities, include, but are not limited to, antimony, arsenic and phosphorous. The concentration of dopants within semiconductor material that provides the source/drain structures can be within ranges typically used in forming metal oxide semiconductor field effect transistors (MOSFETs).

Figure 16A:
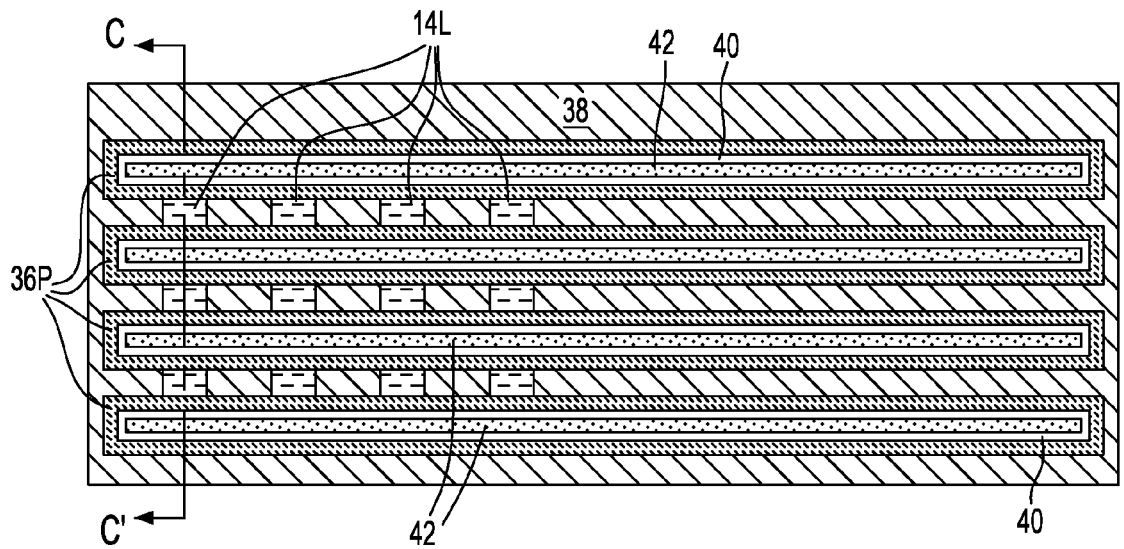
FIG. 16A is a top-down view of the exemplary semiconductor structure of FIGS. 15A-15D after replacing each sacrificial gate structure with a functional gat structure.
Figure 16B:
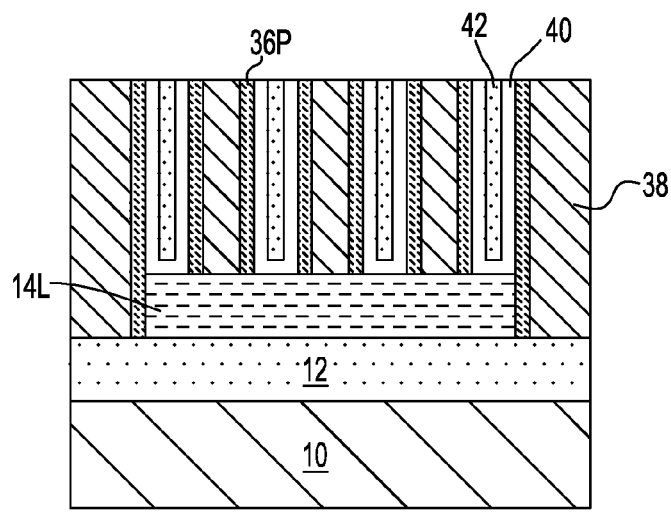
FIG. 16B is a cross-sectional view of the exemplary semiconductor structure of FIG. 16A along the vertical plane C-C'.

Referring now to FIGS. 16A-16B, there is illustrated various views of the exemplary semiconductor structure of FIGS. 15A-15D after replacing each sacrificial gate structure (28P, 30P, 32P) with a functional gate structure (40, 42). In some embodiments, the another protective dielectric liner portion 26P that is located beneath each sacrificial gate structure (28P, 30P, 32P) can be removed at this point of the present application utilizing an etching step. Each functional gate structure (40, 42) straddles over each semiconductor fin 14L.

The exemplary semiconductor structure shown in FIGS. 16A-16B represents one possible configuration. It is also possible to cut the sacrificial gate structures prior to forming the functional gate structures such that each functional gate structure is only present in the FinFET device region. In another embodiment, the functional gate structures shown in FIGS. 16A-16B can be cut after their formation such that the functional gate structures only remain in the FinFET device region.

The replacing of each sacrificial gate structure (28P, 30P, 32P) includes first forming an interlevel dielectric (ILD) material 38 having a topmost surface that is coplanar with a topmost surface of the dielectric spacer 36P and a topmost surface of each sacrificial gate structure (28P, 30P, 32P). In some embodiments, the ILD material 38 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the ILD material 38. The use of a self-planarizing dielectric material as ILD material 38 may avoid the need to perform a subsequent planarizing step. In one embodiment, the ILD material 38 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD material 38, a planarization process or an etch back process follows the deposition of the ILD material 38. The thickness of the ILD material 38 that can be employed in the present application may vary depending on the type of dielectric material employed as well as the method that was employed in forming the same. In one embodiment, the ILD material 38 has a thickness from 80 nm to 500 nm. Other thicknesses that are greater or lesser than the range provided above can also be used for the ILD material 38.

After forming the ILD material 38, each sacrificial gate structure (28P, 30P, 32P) is removed providing a gate cavity (not shown). The each sacrificial gate structure (28P, 30P, 32P) may be removed utilizing an etch process (or etching processes) that is (are) selective in removing the materials that provide each sacrificial gate structure (28P, 30P, 32P). Next, a functional gate structure (40, 42) is formed in each gate cavity and each functional gate structure (40, 42) straddles over a portion of each semiconductor fin 14L. The term "straddling" denotes that each functional gate structure (40, 42) spans over each semiconductor fin 14L. Portions of each first functional gate structure (40, 42) contact sidewall surfaces and, in some instances, a topmost surface of each semiconductor fin 14L.

By "functional gate structure" it is meant a permanent gate structure used to control output current (i.e., flow of carriers in the channel) of a semiconducting device through electrical or magnetic fields. Each functional gate structure that is formed includes a gate material stack of, from bottom to top, a gate dielectric portion 40 and a gate conductor portion 42. In some embodiments, a gate cap portion (not shown) can be present atop the gate conductor portion 42.

The gate dielectric portion 40 comprises a gate dielectric material. The gate dielectric material that provides the gate dielectric portion 40 can be an oxide, nitride, and/or oxynitride. In one example, the gate dielectric material that provides the gate dielectric portion 40 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as the gate dielectric portion 40.

The gate dielectric material used in providing the gate dielectric portion 40 can be formed by any deposition process including, for example, chemical vapor deposition (CVD), plasma enhanced chemical vapor deposition (PECVD), physical vapor deposition (PVD), sputtering, or atomic layer deposition. In some embodiments, the gate dielectric portion 40 of each functional gate structure comprises a same gate dielectric material. In other embodiments, the gate dielectric portion of some of the functional gate structure may comprise a different gate dielectric material than the gate dielectric portion of other functional gate structures. When a different gate dielectric material is used for the gate dielectric portions, block mask technology can be used. In one embodiment of the present application, the gate dielectric material used in providing the gate dielectric portion 40 can have a thickness in a range from 1 nm to 10 nm. Other thicknesses that are lesser than, or greater than, the aforementioned thickness range can also be employed for the gate dielectric material.

The gate conductor portion 42 comprises a gate conductor material. The gate conductor material used in providing the gate conductor portion 42 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor portion of each functional gate structure may comprise a same gate conductor material. In other embodiments, the gate conductor portion of some of the functional gate structures comprises a different gate conductor material from gate conductor portion of other functional gate structures. In some embodiments, gate conductor portion 42 may comprise an nFET gate metal or a p-FET gate metal.

The gate conductor material used in providing the gate conductor portion 42 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions, block mask technology can be used. In one embodiment, the gate conductor material used in providing the gate conductor portion 42 has a thickness from 1 nm to 100 nm. Other thicknesses that are lesser than, or greater than, the aforementioned thickness range can also be employed for the gate conductor material used in providing the gate conductor portion 42.

If present, the gate cap portion comprises a gate cap material. The gate cap material that provides each gate cap portion may include one of the dielectric materials mentioned above for hard mask material. In one embodiment, each gate cap portion comprises silicon dioxide, silicon nitride, and/or silicon oxynitride. The dielectric material that provides each gate cap portion can be formed utilizing a conventional deposition process such as, for example, chemical vapor deposition or plasma enhanced chemical vapor deposition. The dielectric material that provides each gate cap portion can have a thickness from 5 nm to 20 nm. Other thicknesses that are lesser than, or greater than, the aforementioned thickness range can also be employed as the thickness of the dielectric material that provides each gate cap portion.

Each functional gate structure (40, 42) can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
   providing a plurality of semiconductor fins extending upwards from a surface of a substrate, and a plurality of sacrificial spacer fins extending upwards from another surface of said substrate;
   forming a sacrificial gate structure straddling over a portion of each semiconductor fin and each sacrificial spacer fin;
   forming a dielectric spacer material surrounding said sacrificial gate structure, wherein said dielectric spacer material and each sacrificial spacer fin comprise a same dielectric material; and
   performing a spacer reactive ion etch to said dielectric spacer material to provide a dielectric spacer on sidewall surfaces of said sacrificial gate structure, wherein during said spacer reactive ion etch exposed portions of each sacrificial spacer fin are removed, while maintaining a portion of each sacrificial spacer fin beneath said dielectric spacer and said sacrificial gate structure.

2. The method of claim 1, wherein each of said plurality of semiconductor fins has a height and width that is the same as each sacrificial spacer fin.

3. The method of claim 1, wherein said providing said plurality of semiconductor fins comprises:
   forming a first set of semiconductor fins on said surface of said substrate and a set second of semiconductor fins on said another surface of said substrate; and
   replacing each semiconductor fin of said second set of semiconductor fins with a sacrificial spacer material.

4. The method of claim 3, wherein said forming said first set of semiconductor fins and said second set of semiconductor fins comprises:
   providing a semiconductor-on-insulator substrate comprising, from bottom to top, a handle substrate, an insulator layer and a semiconductor material layer; and
   patterning said semiconductor material layer utilizing a sidewall image transfer process or lithography and etching.

5. The method of claim 3, wherein said replacing each semiconductor fin of said second set of semiconductor fins with said sacrificial spacer material comprises:
   forming a protective dielectric liner on surfaces of said first set of semiconductor fins and said set second of semiconductor fins;
   forming a sacrificial dielectric material on said protective dielectric liner and atop each semiconductor fin of said first and second sets of semiconductor fins;
   planarizing said sacrificial dielectric material and said protective dielectric liner to provide a sacrificial dielectric material portion within a U-shaped protective dielectric liner portion, wherein each U-shaped protective dielectric liner portion and each sacrificial dielectric material portion have a topmost surface that is coplanar with a topmost surface of each semiconductor fin of said first and second sets of semiconductor fins;

forming a block mask structure of said first set of semiconductor fins;

removing each semiconductor fin of said second set of semiconductor fins; and providing said sacrificial spacer material within a volume previously occupied by each semiconductor fin of said second set of semiconductor fins.

6. The method of claim 1, wherein said forming said sacrificial gate structure comprises:

forming a protective dielectric liner on exposed surfaces of each semiconductor fin and each sacrificial spacer fin;

forming a sacrificial gate material on said protective dielectric liner and atop each semiconductor fin and each sacrificial spacer fin;

forming a hard mask stack on said sacrificial gate material; and patterning at least said hard mask stack and said sacrificial gate material by lithography and etching.

7. The method of claim 1, wherein during said spacer reactive ion etch each sacrificial spacer fin provides an increased endpoint detection signal.

8. The method of claim 1, wherein said dielectric spacer material and each sacrificial spacer fin comprise silicon nitride.

9. The method of claim 1, further comprising replacing the sacrificial gate structure with a functional gate structure.

10. The method of claim 1, wherein each sacrificial spacer fin is present in a Kerf region of said substrate.

* * * * *